United States Patent
Chiu et al.

(10) Patent No.: US 12,245,444 B2
(45) Date of Patent: Mar. 4, 2025

(54) UPRIGHT PHOTOVOLTAIC CELL WITH FRONT CONTACTS

(71) Applicant: The Boeing Company, Chicago, IL (US)

(72) Inventors: Philip T. Chiu, La Crescenta, CA (US); Dhananjay M. Bhusari, Santa Clarita, CA (US); Richard Thai, Woodland Hills, CA (US)

(73) Assignee: The Boeing Company, Arlington, VA (US)

( * ) Notice: Subject to any disclaimer, the term of this patent is extended or adjusted under 35 U.S.C. 154(b) by 338 days.

(21) Appl. No.: 17/449,421

(22) Filed: Sep. 29, 2021

(65) Prior Publication Data

US 2023/0335653 A1 Oct. 19, 2023

(51) Int. Cl.
| | |
|---|---|
| *H01L 31/18* | (2006.01) |
| *H10F 10/142* | (2025.01) |
| *H10F 10/161* | (2025.01) |
| *H10F 10/19* | (2025.01) |
| *H10F 71/00* | (2025.01) |
| *H10F 77/20* | (2025.01) |
| *H10F 77/70* | (2025.01) |
| *H01L 31/0224* | (2006.01) |
| *H01L 31/0236* | (2006.01) |

(Continued)

(52) U.S. Cl.
CPC ......... *H10F 77/211* (2025.01); *H10F 10/142* (2025.01); *H10F 10/161* (2025.01); *H10F 10/19* (2025.01); *H10F 71/127* (2025.01); *H10F 71/137* (2025.01); *H10F 77/707* (2025.01)

(58) Field of Classification Search
CPC ....... H01L 31/022425; H01L 31/02366; H01L 31/0687; H01L 31/0725; H01L 31/078; H01L 31/184; H01L 31/1876; Y02E 10/544; Y02P 70/50
See application file for complete search history.

(56) References Cited

U.S. PATENT DOCUMENTS 7,732,706 B1 * 6/2010 Mardesich .......... H01L 31/0687
136/261
9,142,615 B2 * 9/2015 Fidaner ............... H01L 29/0657
(Continued)

FOREIGN PATENT DOCUMENTS

CN 112701176 B 6/2021

OTHER PUBLICATIONS

European Patent Office, Extended European Search Report Issued in Application No. 22187288.0, Oct. 19, 2022, Germany, 7 pages.

*Primary Examiner* — Earl N Taylor
(74) *Attorney, Agent, or Firm* — Alleman Hall & Tuttle LLP (57) ABSTRACT

A method for fabricating an upright photovoltaic cell comprises growing one or more epitaxial layers on a substrate, thereby forming a diffused active junction on the substrate and one more additional active junctions above the diffused active junction. The method further comprises selectively etching an areal region of the one or more epitaxial layers, thereby forming a mesa on the substrate and exposing a substrate-contact region parallel to the areal region at a base of the mesa. The method further comprises depositing contact material onto the substrate-contact region, to form the first contact, and concertedly onto a mesa-contact region of the mesa, to form the second contact.

17 Claims, 4 Drawing Sheets

(51) Int. Cl.
*H01L 31/0687* (2012.01)
*H01L 31/0725* (2012.01)
*H01L 31/078* (2012.01)

(56) References Cited

U.S. PATENT DOCUMENTS

| | | | |
|---|---|---|---|
| 2011/0232733 A1* | 9/2011 | Noemayr | H01L 31/041 |
| | | | 136/255 |
| 2013/0105930 A1* | 5/2013 | Zhang | H01L 31/184 |
| | | | 257/E31.119 |
| 2014/0004645 A1 | 1/2014 | Chan et al. | |
| 2014/0097522 A1 | 4/2014 | Fidaner et al. | |
| 2016/0056318 A1* | 2/2016 | Aulnette | H01L 31/0443 |
| | | | 136/246 |
| 2016/0359079 A1* | 12/2016 | Clevenger | H01L 31/0443 |
| 2020/0313013 A1* | 10/2020 | Rehder | H01L 31/048 |
| 2020/0313028 A1* | 10/2020 | Rehder | H01L 31/186 |
| 2020/0335648 A1 | 10/2020 | Hebert et al. | |
| 2023/0335653 A1* | 10/2023 | Chiu | H01L 31/0725 |

\* cited by examiner

UPRIGHT PHOTOVOLTAIC CELL WITH FRONT CONTACTS

GOVERNMENT LICENSE RIGHTS

This invention was made with Government support under FA9453-14-C-0372 and FA8650-12-2-5503 awarded by the Department of Defense. The government has certain rights in this invention.

TECHNICAL FIELD

This disclosure relates generally to photovoltaic cells and particularly to a photovoltaic cell with positive and negative contacts on the front side of the photovoltaic cell.

BACKGROUND

Photovoltaic (PV) cells, often referred to as 'solar cells', convert light into electrical energy. A PV cell includes at least one band-gap material, typically a semiconductor, that generates electron-hole pairs upon absorption of light. The band-gap material supports at least one p-n junction across which the electron-hole pairs are separated. Contacts arranged on either side of the p-n junction allow electrons to be drawn from the n-side and returned to the p-side, thereby providing electric current to an external load.

SUMMARY

One aspect of this disclosure is directed to an upright PV cell. The PV cell comprises a substrate, a mesa including one or more epitaxial layers grown on the substrate, and first and second contacts. The mesa defines a diffused active junction with the substrate, one or more additional active junctions above the diffused active junction, a mesa-contact region on the mesa, and a substrate-contact region exposed at the base of the mesa. The first contact includes contact material deposited in the substrate-contact region, on the front side of the PV cell. The second contact includes contact material deposited in the mesa-contact region, also on the front side of the PV cell.

Another aspect of this disclosure is directed to a method for fabricating an upright PV cell having a front side and first and second contacts arranged on the front side. The method comprises growing one or more epitaxial layers on a substrate, thereby forming a diffused active junction on the substrate and one more additional active junctions above the diffused active junction. The method further comprises selectively etching an areal region of the one or more epitaxial layers, thereby forming a mesa on the substrate and exposing a substrate-contact region parallel to the areal region at a base of the mesa. The method further comprises depositing contact material onto the substrate-contact region, to form the first contact, and concertedly onto a mesa-contact region of the mesa, to form the second contact.

This Summary is not intended to identify key features or essential features of the claimed subject matter, nor is the scope of the claimed subject matter limited to implementations that address any problems or disadvantages noted in any part of this disclosure. The features, functions, and advantages described herein may be achieved independently in some implementations but may be combined in other implementations.

BRIEF DESCRIPTION OF THE DRAWINGS

This disclosure will be better understood from reading the following Detailed Description with reference to the attached drawing figures, wherein.

DETAILED DESCRIPTION

When irradiated by monochromatic light comprising photons matched in energy to the band gap, a single-junction PV cell can operate at very high conversion efficiency. Sunlight is polychromatic, however, comprising photons of a broad distribution of energies. Accordingly, a single-junction PV cell with a wide band gap will absorb relatively few photons and will generate relatively little current. A single-junction PV cell with a low band gap will absorb more of the photons, but minority charge carriers generated by photons higher in energy than the band gap will thermalize down to the band edge before charge separation can occur. Thus the PV cell will generate relatively low voltage. Due to the current-voltage tradeoff, the optimal conversion efficiency of an insolated, single-junction PV cell with a well-chosen band gap is limited to about 30%.

Multi-junction PV cells surpass the 30% limit by providing a layered structure of two or more light-absorbing materials with different band gaps. Higher-energy photons are absorbed by wide-band-gap materials with junctions providing relatively high built-in voltage. Lower-energy photons pass through to lower-band-gap material, where they too are absorbed and provide additional energy. Thus, a multi-junction PV cell may convert sunlight to electricity at substantially higher efficiencies. Due to the increased efficiency, multi-junction PV cells are attractive for powering electrically driven aircraft, spacecraft, and orbital satellites.

A PV cell can be fabricated starting with a suitable semiconductor substrate and built up layer-by-layer via epitaxial deposition. Some multi-junction PV cells have front and back contacts—i.e., a front contact on the front side of the cell, where the epitaxial layers are arranged, and a back contact on the opposite, back side of the PV cell. When PV cells so fabricated are integrated into a multi-cell solar panel, the front and back contacts are welded to the respective busses that carry the electric current generated by the cells.

For some PV-cell architectures, welding on the back side of the PV cell is problematic because the substrate is mechanically fragile. While the front side of the substrate may be reinforced by a stack of epitaxial layers and/or coatings, the back side is reinforced only by the back contact itself, typically a thin metal film. This issue is further amplified in so-called 'thin' or 'flexible' PV cells, where the substrate is reduced in thickness to 100 micrometers (μm) or less before the back contact is applied. Thin PV cells are attractive not only for flexibility but also in view of the higher specific power available relative to standard-thickness PV cells, which is a benefit in aerospace applications. In these and other examples, mechanical and thermal stresses that occur during welding of the back contact may result in damage to, and necessitate replacement of, a PV cell. This issue may significantly increase the manufacturing cost of high-performance solar panels, including multi-junction cells.

To address these issues and to provide further advantages, the inventors herein have devised an upright PV-cell architecture with both positive and negative contacts arrange on the front (i.e., insolation) side of the cell, as well as a method for fabricating the same. By arranging both positive and negative contacts on the front side of the PV cell, the disclosed solution obviates the need to weld to the back side. Preliminary results indicate that the disclosed approach significantly reduces the frequency of PV-cell damage in high-performance solar-panel manufacture.

The balance of this disclosure is presented by way of example, with reference to the drawing figures listed above. Components, process steps, and other elements that can be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

Figure 1:
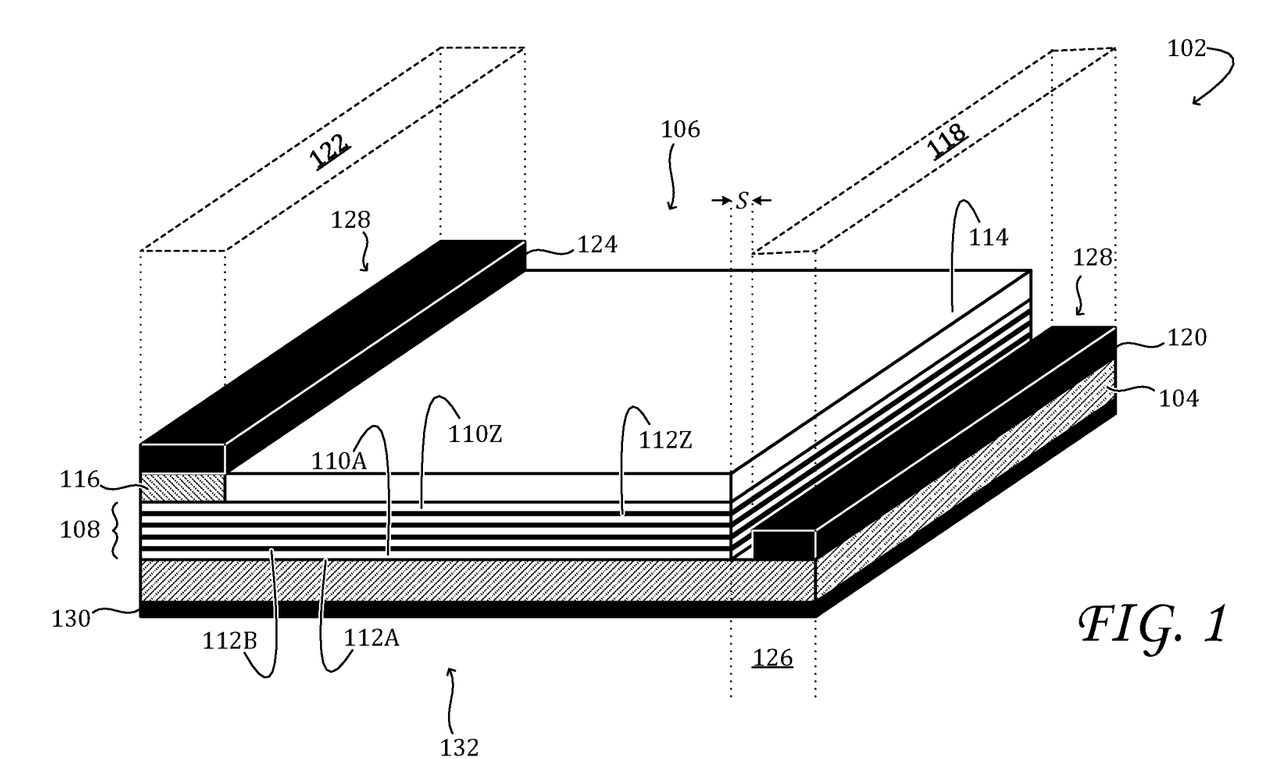
FIGS. 1 and 2 show aspects of an example upright PV cell in schematic detail.

Turning now to the drawings, FIG. 1 schematically shows aspects of an example upright PV cell 102 including a substrate 104. A PV cell is 'upright' (as opposed to 'inverted') if configured to be insolated through the layers deposited on the substrate, such that the incident light passes first through the last layer deposited (i.e., the front layer), then through the next-to-last layer and so on, and finally down to the substrate. (By contrast, in an inverted PV cell, the substrate supporting the layer-by-layer epitaxy is ultimately removed, providing a structure in which incident light passes through the layers in the reverse order; an inactive carrier substate is bonded to the last-deposited epitaxial layer for mechanical support.) Accordingly, upright PV cell 102 of FIG. 1 is configured to be insolated on front side 106, through various layers to be described presently. In the examples herein, substrate 104 can comprise a semiconductor—e.g., a die portion of a semiconductor wafer. Semiconductor materials suitable for substrate 104 include silicon, germanium, alloys thereof, and various III, V semiconductors and alloys, such as indium phosphide, gallium arsenide, and indium-gallium phosphide. It will be understood that these examples and others listed in this disclosure are provided for the sake of illustration and are not intended to be limiting in any sense.

Continuing in FIG. 1, mesa 108 is arranged on substrate 104. Generally speaking, the mesa includes one or more epitaxial layers 110 grown on substrate 104. In the example shown in FIG. 1, PV cell 102 is a multi-junction PV cell, where the one or more epitaxial layers comprise dissimilar material layers. The mesa defines, relative to the substrate, a diffused active junction 112A. In effect, the diffused active junction is the interface between substrate 104 and first epitaxial layer 110A of the mesa. An 'active' junction, by virtue of its built-in voltage, actively separates electron-hole pairs generated by absorption of light in proximity to the junction. This diffused active junction is formed directly on the substrate. The mesa also defines, in view of its layer structure, one or more additional active junctions 112 situated above diffused active junction 112A. The number of active junctions of PV cell 102 is not particularly limited. In some examples three or four junctions may provide an acceptable trade-off between energy-conversion efficiency and fabrication complexity.

Top epitaxial layer 110Z of mesa 108 can comprise a semiconductor material having the widest band gap of any semiconductor material of PV cell 102. For instance, top epitaxial layer 110Z can comprise gallium nitride with a band gap of 3.44 electron-volts (eV), or gallium phosphide with a band gap of 2.26 eV. Electron-hole pairs generated by absorption of short-wavelength light within and directly below epitaxial layer 110Z are separated at active junction 112Z, which has a high built-in voltage. Longer-wavelength light may pass through to epitaxial layer 110A, comprising a semiconductor material having a band gap narrower than the band gap of epitaxial layer 110Z but wider than the band gap of the substrate. For instance, epitaxial layer 110A can comprise gallium arsenide, with a band gap of 1.43 eV. Electron-hole pairs generated by absorption of longer-wavelength light within and directly above epitaxial layer 110A are separated at active junction 112B, which has high built-in voltage lower than active junction 112Z. Light of still longer wavelength may pass through to substrate 104, comprising a semiconductor material having the lowest band gap of any semiconductor material of PV cell 102. For instance, the substrate can comprise germanium with a band gap of 0.67 eV. The substrate can be 'active' in the sense that it is configured to absorb photons that pass through mesa 108 and to accumulate charge carriers created in the substrate when such photons are absorbed.

In some examples, as shown in FIG. 1, mesa 108 can include additional, intermediate epitaxial layers with band gaps arranged wide to narrow from epitaxial layer 110Z to substrate 104. In some examples, the mesa can also include various barrier layers and associated junctions configured to modify the electric-potential gradient through the mesa, so as to increase the efficiency of charge-carrier transport.

Continuing in FIG. 1, mesa 108 includes first anti-reflective layer 114 and cap layer 116. The first anti-reflective layer may comprise a layer of predetermined thickness and/or refractive index configured to quell reflection of the insolation over a predetermined range of angles. The composition of the first anti-reflective layer is not particularly limited. The cap layer is a highly doped layer of whichever semiconductor comprises top epitaxial layer 110Z. In other words, in the non-limiting example in which the top layer is gallium arsenide, a highly doped gallium-arsenide cap layer is provided as an interface between the top epitaxial layer and the contact material (typically comprising one or more metals, vide infra). The mesa can also include a second, similarly configured anti-reflective layer arranged over the first anti-reflective layer (not shown in FIG. 1).

Substrate 104 of PV cell 102 includes a substrate-contact region 118 where first contact 120 is arranged. Likewise, mesa 108 includes a mesa-contact region 122 where second contact 124 is arranged. The substrate-contact region is exposed at base 126 of the mesa. In the example illustrated in FIG. 1, base 126 is situated at one end of the mesa, and mesa-contact region 122 is situated at the opposite end of the mesa.

First contact 120 and second contact 124 are both arranged on front side 106 of PV cell 102. Both contacts are positioned above the active substrate (i.e., on the front side, from which insolation is received). In examples in which substrate 104 is p-doped, the first contact can be the negative contact of the PV cell, and the second contact can be the positive contact of the PV cell. The reverse configuration can be used with n-doped substrates. Typically each of the first and second contacts are ohmic contacts. The first and second contacts are each comprised of a contact material 128. First contact 120 includes contact material deposited in substrate-contact region 118, on front side 106 of the PV cell. Second contact 124 includes contact material deposited in mesa-contact region 122, also on the front side of the PV cell. The composition of the contact material is not particularly limited and may depend on the type of PV cell being fabricated. Generally speaking, the contact may comprise one or more metals. In some examples, the contact material may further comprise one or more metalloids or semiconductors that improve the contact quality or adherence of the contact to the underlying semiconductor.

In some examples, as shown in FIG. 1, a thin metal film 130 can be arranged on substrate 104 on back side 132 of PV cell 102.

Figure 2:
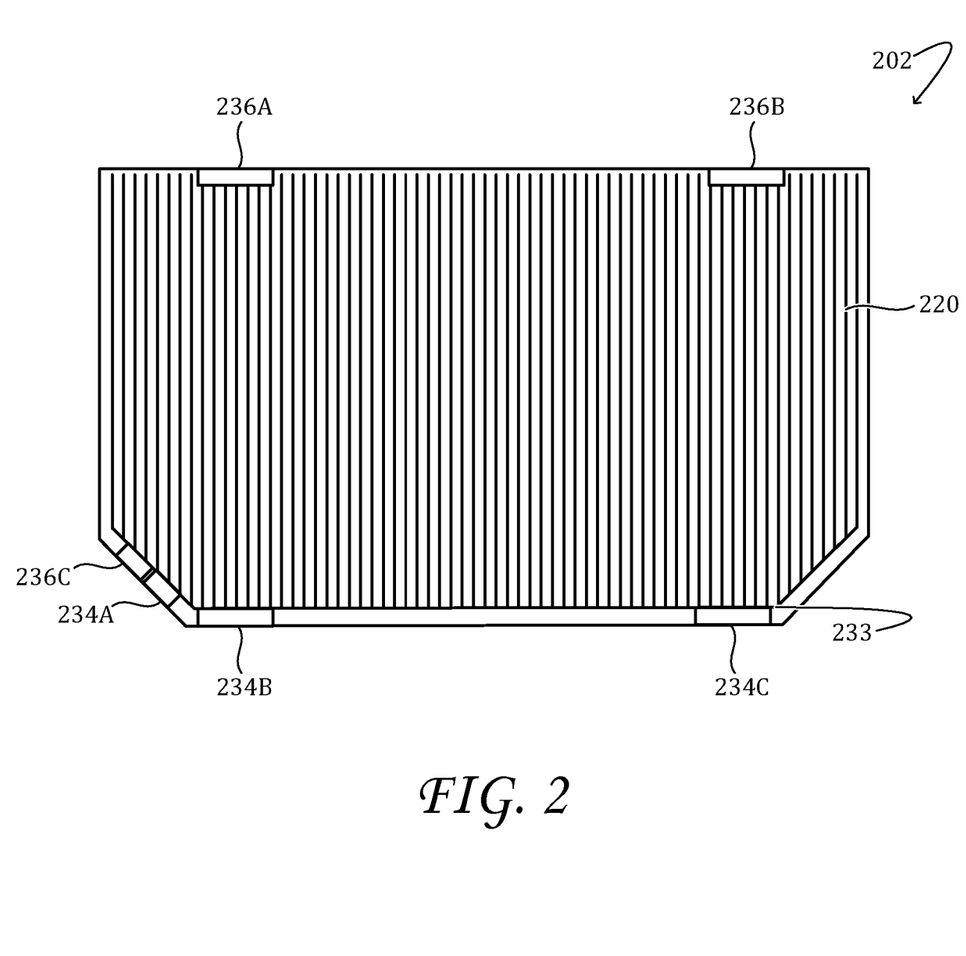

FIG. 2 shows aspects of an example PV cell 202 in plan view, as seen from the front side of the PV cell. The PV cells represented in FIGS. 1 and 2 can be substantially the same in some examples, but may differ in other examples. In PV cell 202, gridlines 220 run down the front side to busbar 233. In the illustrated example, busbar 233 is broadened into a plurality of first-polarity welding pads 234A, 234B, and 234C. FIG. 2 also shows a plurality of second-polarity welding pads 236A, 236B, and 236C. The welding pads are the loci of PV cell 202 to which a weld is made when the PV cell is integrated into a solar panel.

Figure 3:
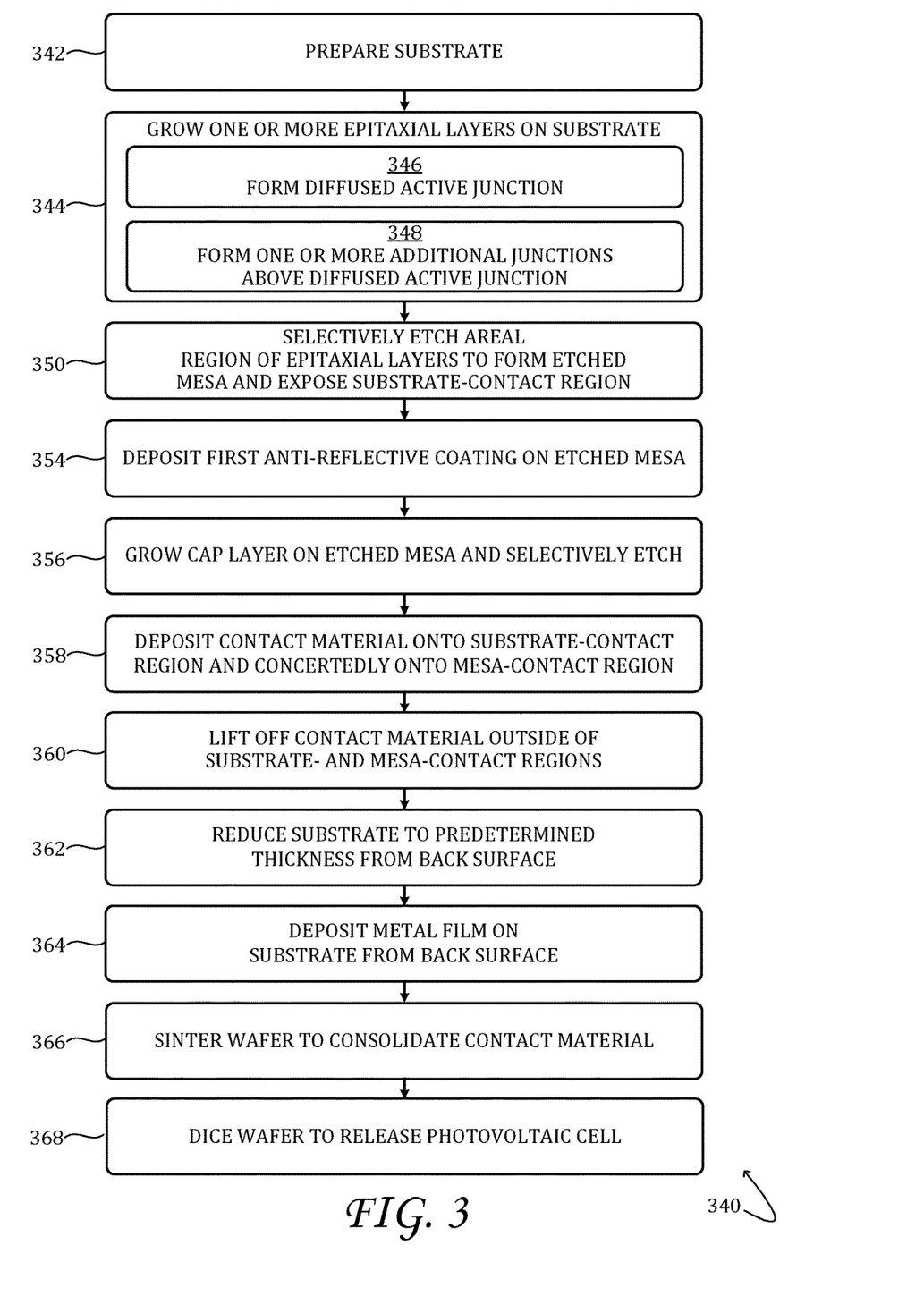
FIGS. 3 and 4 show aspects of an example method for fabricating an upright PV cell.
Figure 4:
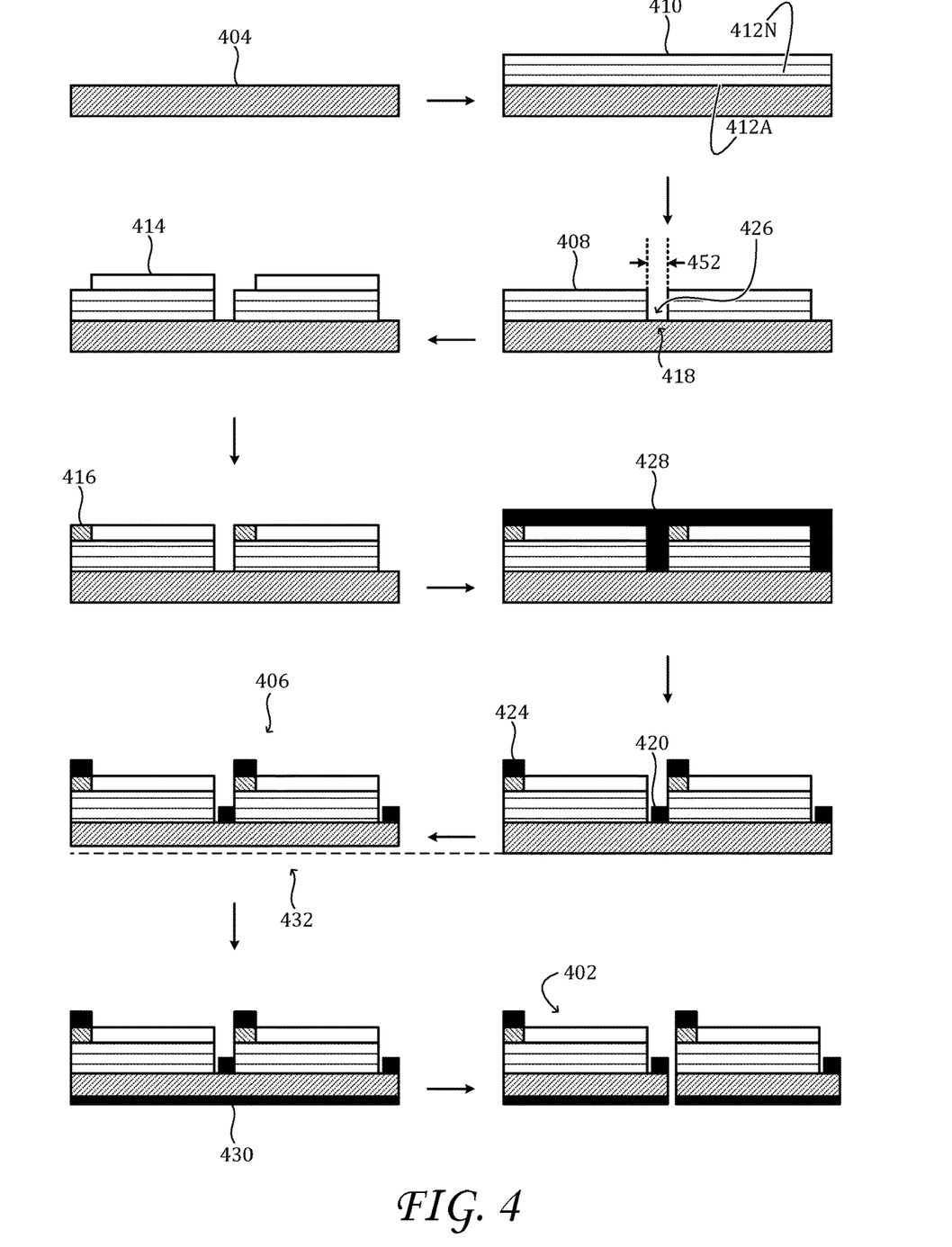

FIG. 3 shows aspects of an example method 340 for fabricating an upright PV cell, and FIG. 4 schematically illustrates an evolving structure of an upright PV cell at selected stages of the method. For ease of understanding, method 340 is described with reference to the PV-cell configurations of FIGS. 1 and 2. It will be understood, however, that method 340 can be used to fabricate PV cells of different configurations. In some, non-limiting examples, method 340 can be applied to the fabrication of a 'thin' upright PV cell, which can be flexible, bendable, twistable, and/or rollable. As noted above in connection to the PV-cell configurations herein, a PV cell fabricated according to method 340 has both positive and negative contacts arranged on the front side.

At 342 of method 340 a suitable substrate for the PV cell—substrate 404 in FIG. 4—is prepared. The substrate may comprise a semiconductor as noted hereinabove. To that end, a semiconductor wafer can be sliced from a boule or obtained in any other manner. The wafer may comprise silicon, germanium, alloys thereof, or various III, V semiconductors and alloys, such as indium phosphide, gallium arsenide, and indium-gallium phosphide. The semiconductor wafer can be subject to mechanical, chemical, and/or plasma etching to expose a surface suitable for epitaxial deposition.

At 344 of method 340 one or more epitaxial layers are grown on the prepared substrate. Layers can be deposited via state-of-the-art semiconductor fabrication methods. Such methods may include surface passivation, photolithography, ion implantation, dry etching, reactive-ion etching, atomic-layer etching, wet etching, plasma ashing, laser etching (or ablation), thermal oxidation, thermal annealing, chemical- and physical-vapor deposition, atomic-layer deposition, electrochemical deposition, and/or molecular-beam epitaxy. In growing the first of the one or more epitaxial layers, a diffused active junction is formed on the substrate, at 346. At 348, one or more additional active junctions are formed above the diffused active junction. FIG. 4 identifies diffused active junction 412A and an additional active junction 412N in the one or more epitaxial layers 410.

At 350 an areal region of the one or more epitaxial layers is selectively etched. The areal region can be etched selectively via one or more of chemical etching, laser etching, plasma etching, mechanical etching, and saw cutting, as examples. Shown schematically in FIG. 4, selective etching of areal region 452 forms a mesa 408 on the substrate and exposes a substrate-contact region 418 parallel to the areal region, at base 426 of the mesa. As noted hereinabove, the base can be arranged at one end of the mesa, and the mesa-contact region can be arranged at the opposite end of the mesa. In the example shown in FIG. 4, areal region 452 comprises an elongate strip. The elongate strip can extend substantially from one side of substrate 404 to the opposite side of the substrate. In more particular examples, the elongate strip can be about 100 µm in width. In some examples selective etching of the areal region may comprise coating the one or more epitaxial layers with uncured resin and photochemically curing the regions outside of the areal region via a suitable photomask. Chemical and/or plasma etching can be used then to form the mesa. In other examples, a directed etch can be used. In some examples the areal region can be selectively etched down to the level of the substrate.

At 354 a first anti-reflective layer is deposited on the mesa, prior to deposition of contact material. First anti-reflective layer 414 of FIG. 4 can be deposited selectively, beginning with photolithographic protection of the mesa- and substrate-contact regions. The first anti-reflective layer can be deposited via chemical-vapor deposition (CVD), plasma-enhanced CVD (PECVD), or the like, and then the material deposited over the protected regions is removed.

At 356 a cap layer is grown on the mesa-contact region of the mesa. Cap layer 416 of FIG. 4 can be grown everywhere on the mesa and then subjected to a photoetch in which the cap layer is etched away outside of the mesa-contact region. Deposition and selective etching of the cap layer can be enacted via CVD, PECVD, etc.

At 358 of method 340 contact material is deposited onto the substrate-contact region of the substrate, to form a first contact, and concertedly onto the mesa-contact region of the mesa, to form a second contact. The first and second contacts are of opposite polarity. In some examples, as shown in FIG. 4, contact material 428 can be deposited after suitable photomasking over the entire wafer. The contact material can be deposited via sputtering and/or thermal evaporation, for instance. These techniques can be used to form the first and second contacts concertedly. At 360 excess contact material is lifted off from of areas outside of the substrate- and mesa-contact regions, thereby defining first contact 420 and second contact 424. In some examples, the excess contact material can be lifted off via a laser lift-off procedure. The first contact can be narrower, after the lift-off procedure at 360, than the areal region selectively etched from the mesa at 350. Accordingly, the combined acts of selectively etching the mesa, depositing the contact material, and lifting off the excess contact material, can provide a standoff between the mesa and the first contact. In some examples the width of the standoff is 30 µm or wider. As described in further detail hereinafter, a standoff of sufficient width may provide protection against short-circuiting of the PV cell. In some examples, a second anti-reflective layer can deposited on the mesa after selective etching of the cap layer (at 356) and before depositing the contact material (at 358).

As shown in FIG. 4, the PV cell fabricated according to method 340 includes a back side 432 opposite front side 406. At 362 the substrate thickness is reduced incrementally from the back side. The substrate thickness can be reduced in order to increase the efficiency of charge-carrier collection and to reduce the volume in which bulk recombination of charge carriers may occur. Typically the substrate thickness is reduced to a predetermined thickness. In some examples, the substrate is reduced to a thickness of between 25 and 225 µm. A substrate thickness at the upper end of this range is used in standard-thickness PV cells. A substrate thickness at the lower end of the range (e.g., 25 to 100 µm) is used for 'thin' PV cells. In some examples, the substrate thickness can be reduced by mechanical abrasion (i.e., grinding) from the back side of the PV cell.

At 364 of method 340 a metal film—metal film 430 in FIG. 4—is deposited onto the substrate from back side 432 of the PV cell. The metal film can be deposited by thermal evaporation, sputtering, CVD, or PECVD, as examples.

As noted hereinabove the substrate may comprise a portion of a wafer. At 366 the wafer, with the mesa and the contact material deposited thereon, is sintered in order to consolidate the contact material. At 368 the wafer, with the mesa and the contact material deposited thereon, is diced to singulate and release the PV cell (PV cell 402 in FIG. 4) from the wafer.

Upright PV cells as illustrated in FIGS. 1 and 2, and as fabricated according to the method of FIG. 3, provide certain advantages over upright PV cells that have contacts on the back side of the cell.

First, it will be noted that the overall process flow of FIG. 3 includes the same number of steps that would be used to fabricate an upright PV cell having front and back contacts. This is because the first and second contacts are formed concurrently at step 358 of the method. Thus, the method of FIG. 3 can be enacted with very little additional fabrication time or expense, relative to methods for fabricating upright PV cells having front and back contacts.

Significantly, the type of PV cell illustrated in FIGS. 1 and 2, and as fabricated according to the method of FIG. 3, can be integrated into a solar panel comprising multiple plural PV cells with no need to weld onto the back side of any cell. Rather, the welding operation can be limited to joining the multiple negative contacts, arranged on the front side, and to joining the multiple positive contacts, also arranged on the front side. As noted hereinabove, the front side of a PV cell is typically more resistant than the back side to mechanical and thermal stresses associated with the welding operation. In preliminary results, the PV-cell failure rate for integration of one type of PV cell dropped from 22%, for cells having front and back contacts, to near 0% for cells fabricated according to the method of FIG. 3. Furthermore, in PV cells that survive the back-side weld process intact, the weld itself may impart significant thermal-expansion stress to the back of the cell, which may cause separation of the weld during panel operation. Further still, elimination of the back-side weld reduces cycle time and, in some cases, labor costs for solar-cell manufacture.

It was also determined, in this study, that the very low failure rate of PV cells fabricated according to the method of FIG. 3 is somewhat correlated to the width of the standoff reserved at the base of the mesa of a PV cell (width S in FIG. 1). The failure rate was about 10% lower for PV cells in which a width of 100 μm is reserved relative to analogous PV cells in which the reserved width is only 30 μm. The reserved width is referred to hereinabove as areal region 452. Without tying this result to any particular theory, it is possible that areal-region widths on the narrower end of the 30-to-100 μm range may allow contact material of the first (substrate) contact to touch one or more layers of the mesa, thereby creating a low-resistance shunt across the PV cell.

Upright PV cells fabricated according to the method of FIG. 3 have figures of merit (open-circuit voltages, short-circuit currents ($J_{sc}$), and fill factors) approaching those of otherwise similar upright PV cells with front and back contacts. In one study a small reduction in $J_{sc}$ was observed. By inference, that effect can be attributed to the presence of additional, opaque contact material arranged on the front side of the PV cell. In many scenarios, the tradeoff of slightly lower $J_{sc}$ in exchange for significantly reduced weld attrition and other benefits is an overall advantage.

It will be understood that the configurations and/or approaches described herein are exemplary in nature, and that these specific embodiments or examples are not to be considered in a limiting sense, because numerous variations are possible. The specific routines or processes described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for fabricating an upright photovoltaic cell having a front side and first and second contacts arranged on the front side, the method comprising:
   growing a first epitaxial layer on a substrate, thereby forming a diffused active junction on the substrate;
   growing one or more additional epitaxial layers on the substrate, thereby forming one or more additional active junctions above the diffused active junction;
   selectively etching an areal region of the first and one or more additional epitaxial layers, thereby forming a mesa on the substrate and exposing a substrate-contact region parallel to the areal region at a base of the mesa;
   depositing contact material onto the substrate-contact region, to form the first contact, and concertedly onto a mesa-contact region of the mesa, to form the second contact; and
   lifting off the contact material outside of the substrate- and mesa-contact regions, wherein etching the mesa, depositing the contact material, and lifting off the contact material provides a standoff between the mesa and the first contact.

2. The method of claim 1 wherein selectively etching the areal region includes etching one or more of chemical etching, laser etching, and mechanical etching.

3. The method of claim 1 wherein the base is at one end of the mesa, and the mesa-contact region is at an opposite end of the mesa.

4. The method of claim 1 further comprising depositing a first anti-reflective layer on the mesa before depositing the contact material.

5. The method of claim 1 further comprising growing a cap layer on the mesa and selectively etching the cap layer outside of the mesa-contact region.

6. The method of claim 5 wherein depositing the contact material comprises depositing via concerted evaporation of the contact material onto the substrate-contact region and onto the mesa-contact region.

7. The method of claim 1 wherein the photovoltaic cell includes a back side opposite the front side, the method further comprising grinding the substrate to predetermined thickness from the back side.

8. The method of claim 7 further comprising depositing a metal film on the substrate from the back side.

9. The method of claim 7 wherein the substrate is reduced to a thickness of between 25 and 225 micrometers.

10. The method of claim 1 wherein the substrate comprises a portion of a wafer, the method further comprising sintering the wafer with the mesa and the contact material to consolidate the contact material.

11. The method of claim 10 further comprising dicing the wafer with the mesa and the contact material to singulate the photovoltaic cell from the wafer.

12. A method for fabricating a thin, upright photovoltaic cell having a front side, a back side opposite the front side, and first and second contacts arranged on the front side, the method comprising:
- growing a first epitaxial layer on a semiconductor substrate, thereby forming a diffused active junction on the semiconductor substrate;
- growing one or more additional epitaxial layers on the semiconductor substrate, thereby forming one or more additional active junctions above the diffused active junction;
- selectively etching an areal region of the first and one or more additional epitaxial layers, thereby forming a mesa on the semiconductor substrate and exposing a substrate-contact region parallel to the areal region at a base of the mesa;
- depositing contact material onto the substrate-contact region, to form the first contact, and concertedly onto a mesa-contact region of the mesa, to form the second contact; and
- grinding the semiconductor substrate to predetermined thickness from the back side.

13. The method of claim 12 further comprising depositing a thin metal film to the substrate from the back side.

14. The method of claim 12 further comprising lifting off the contact material outside of the substrate- and mesa-contact regions, wherein etching the mesa, depositing the contact material, and lifting off the contact material provides a standoff between the mesa and the first contact.

15. The method of claim 14 wherein the standoff is 30 micrometers or wider.

16. The method of claim 12 wherein selectively etching the areal region includes etching one or more of chemical etching, laser etching, and mechanical etching.

17. The method of claim 12 wherein the base is at one end of the mesa, and the mesa-contact region is at an opposite end of the mesa.

* * * * *